(12) United States Patent
Matsubara

(10) Patent No.: US 7,692,992 B2
(45) Date of Patent: Apr. 6, 2010

(54) SEMICONDUCTOR STORAGE DEVICE IN WHICH INACTIVE WORD LINE POTENTIAL IS SET

(75) Inventor: Yasushi Matsubara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 139 days.

(21) Appl. No.: 11/984,052

(22) Filed: Nov. 13, 2007

(65) Prior Publication Data

US 2008/0144416 A1    Jun. 19, 2008

(30) Foreign Application Priority Data

Dec. 13, 2006  (JP) .............................. 2006-335244

(51) Int. Cl.
G11C 7/00    (2006.01)

(52) U.S. Cl. .................................. 365/222; 365/189.09

(58) Field of Classification Search ............ 365/189.09, 365/222

See application file for complete search history.

(56) References Cited

U.S. PATENT DOCUMENTS

| | | | |
|---|---|---|---|
| 5,617,369 | A | 4/1997 | Tomishima et al. |
| 6,335,893 | B1 | 1/2002 | Tanaka et al. |
| 7,248,525 | B2 | 7/2007 | Sato et al. |
| 7,315,481 | B2 | 1/2008 | Ito |
| 7,463,529 | B2 | 12/2008 | Matsubara |
| 2002/0024873 | A1* | 2/2002 | Tomishima et al. .... 365/230.06 |
| 2003/0043673 | A1 | 3/2003 | Hashimoto et al. |
| 2006/0023542 | A1* | 2/2006 | Derner et al. ............... 365/222 |
| 2008/0253213 | A1 | 10/2008 | Sato et al. |

FOREIGN PATENT DOCUMENTS

| | | |
|---|---|---|
| JP | 4-114393 A | 4/1992 |
| JP | 7-307091 | 11/1995 |
| JP | 8-279285 A | 10/1996 |
| JP | 11-31384 | 2/1999 |
| JP | 11-144458 | 5/1999 |
| JP | 11-283367 | 10/1999 |
| JP | 2003-30984 | 1/2003 |
| JP | 2003-77273 | 3/2003 |
| JP | 2006-252636 A | 9/2006 |
| JP | 2007-257707 A | 10/2007 |
| WO | WO98/58382 | 12/1998 |
| WO | WO 2004/077444 A1 | 9/2004 |

OTHER PUBLICATIONS

Japanese Office Action dated Dec. 3, 2008 with Partial English-Language Translation.
Japanese Office Action issued on Sep. 16, 2009 for JP 2006-335244 (partial) with partial English-language translation.
US 7,414,910, 08/2008, Sato et al. (withdrawn)

* cited by examiner

Primary Examiner—Hoai V Ho
(74) Attorney, Agent, or Firm—McGinn IP Law Group, PLLC

(57) ABSTRACT

A potential level of a word line when it is inactive is made different between during a self-refresh operation and during other than the self-refresh operation. The potential level is set to a ground potential GND during the self-refresh operation and set to a negative potential during other than the self-refresh operation.

20 Claims, 2 Drawing Sheets

SEMICONDUCTOR STORAGE DEVICE IN WHICH INACTIVE WORD LINE POTENTIAL IS SET

This application is based upon and claims the benefit of priority from Japanese patent application No. 2006-335244, filed on Dec. 13, 2006, the disclosure of which is incorporated herein in its entirety by reference.

BACKGROUND OF THE INVENTION

1. Field of the Invention

The present invention relates to a semiconductor storage device, and in particular to self-refresh control for reducing current consumption during self-refresh operation.

2. Description of the Related Art

Recent developments in portable digital equipment have allowed such equipment to have a variety of functions. Therefore, the portable digital equipment is equipped with a large number of semiconductor devices such as a CPU, a storage device and so on. Since the portable digital equipment is driven by a battery, it is not allowed to increase its current consumption even though the number of mounted semiconductor devices is increased. Therefore, the reduction of current consumption of the semiconductor devices mounted therein is strongly desired. For example, as the functions of a cellular phone are expanded to an extent equivalent to those of a laptop computer, the demand for reduction of current consumption of a dynamic random access memory (hereafter, referred as DRAM) is being increased.

In a cellular phone, in particular, the waiting time for which the phone is in a call waiting state is considerably long in comparison with the use time. Therefore, the reduction of current consumption during this waiting time is important. On the other hand, a DRAM requires a refresh operation for holding stored information even during the waiting time. A refresh operation performed during the waiting time is referred to as a self-refresh operation. The self-refresh operation is carried out automatically by the DRAM itself. The reduction of current consumption in the DRAM is therefore achieved by suppressing the refresh current flowing through a cell, and reducing the direct current flowing constantly. The suppressing of the refresh current is achieved by setting the interval between refreshes as long as possible, in other words, by minimizing the leak current from the cell.

The direct current mentioned in the above consists of a direct current flowing to a power supply circuit within the DRAM, a total of all the transistor leak currents within the DRAM, and a defect current within the DRAM. The reduction of the direct current has been conventionally achieved by reducing the direct current to the power supply circuit and the leak current in the transistors. Recently, however, the reduction of these currents has reached its maximum level, and no further reduction is possible. Accordingly, the defect current has become to draw more attention in this respect. It is obvious also from the fact that the ratio of the defect current (that is now in the order of 60 uA) to the entire current (of about 100 uA) has become greater.

For example, the potential of a word line in the standby (inactive) state is set to a negative level (negative potential) in order to reduce the leak current of the memory cell transistor. This method is referred to as a negative word line method. The reason why the potential of the word line in the inactive state is set to a negative potential is to prevent electric charge stored in the memory cell (storage node) from being leaked away due to variation in potential of a bit line. Consideration is given here to a case in which a high potential (array potential VARY) is stored in the capacity of a memory cell. When a bit line is at 0 V and a word line at a level of around 0 V, leakage of a very small amount of current occurs in the memory cell transistor so that the built-up array potential VARY is decreased. The decrease of the potential built up in the memory cell causes decrease in margin for read operation, which may finally induce a problem of read failure.

In order to reduce the leak current, the potential of the inactive word line is set to a negative potential, for example to −0.3 V. The memory cell transistor is an N-channel type transistor. When the potential of the inactive word line is set to −0.3 V, the gate potential becomes −0.3 V, the source potential becomes 0 V, and the drain potential becomes the array potential VARY In this case, the gate-source potential Vgs becomes −0.3 V, the channel is depleted, and the leak current is reduced. The potential of the inactive word line, or −0.3 V is represented as the negative potential VKK. This negative potential VKK is not supplied from the outside of the DRAM chip, but supplied by being internally generated by a pump circuit provided in the DRAM chip. Since the negative potential VKK is generated by the pump circuit, the current consumption is increased by that much when current is supplied to the negative potential VKK. For example, if a current of 1 mA is supplied to the negative potential VKK, a current of 3 mA is consumed by the pump circuit to generate the same.

When there exists a short-circuit defect on a word line in the inactive state at a negative potential, the defect current problematically increases. The probability is extremely high that one of several thousands of word lines present in the DRAM will have a defect of short-circuiting with a bit line, and several or several tens of chips among several hundreds of chips have such short-circuit defect. These memory cells having the short-circuit defect are replaced by a redundancy circuit. However, the short-circuit defect is left on the chip, possibly causing a defect current. The number of the short-circuit defects is obviously associated with a proficiency of the process. There will occur a greater number of defects in an initial stage of developing the process. The word lines in the waiting state in the DRAM are at the negative potential VKK, while the bit lines are at a precharge potential. The precharge potential is a potential corresponding to a half of the potential of the array potential VARY (hereafter, referred to as half VARY). In a DRAM having a short-circuit defect, therefore, a defect current flows from the potential of the bit line (half VARY) to the word line (VKK).

This current is a loss current caused by the defect. For example, when a loss current of 300 uA flows to the negative potential VKK, a loss current in the pump circuit becomes 900 uA. Thus, a loss current of 1200 uA (1.2 mA) flows in the DRAM as a whole. A standby current of a DRAM mounted on a cellular phone is a current when the cellular phone is in standby while performing the self-refresh operation. The value of the current during the self-refresh operation (referred to as IDD6 specification) is 1 mA or lower at a temperature around 40° C. In an example of a 512M DRAM, the practical current value is about 500 uA or lower. If this value is the specification value of the DRAM, the value of the loss current is relatively too large to be allowed. Accordingly, the DRAM is rejected according to the IDD6 specification. The word line and the bit line including a short circuit are replaced by a redundancy circuit, so that the operation of the DRAM is not impaired. However, there still occurs a problem that the DRAM is rejected on the basis of the electric current specification.

There are prior patent references describing the negative word line method and refresh of the DRAM. For example, Japanese Laid-Open Patent Publication H11-144458 (Patent Reference 1) describes a technique in which the potential of a word line is set to a boosting potential VPP and a negative level Vnn. According to Japanese Laid-Open Patent Publication H11-31384 (Patent Reference 2) and Japanese Laid-Open Patent Publication 2003-30984 (Patent Reference 3), the reset potential of a word line is changed first to a ground potential and then to a negative level. According to Japanese Laid-Open Patent Publication H11-283367 (Patent Reference 4), a refresh control circuit is provided to set a refresh mode. None of these prior patent references, however, discloses or suggests the problems to be solved by the present invention or a technique to solve the problems.

SUMMARY OF THE INVENTION

As described above, the reduction of current consumption is strongly required for recent portable equipment. Therefore, the reduction of current consumption is imperative also for a DRAM used therein. When the portable equipment is in the waiting state, particularly, the DRAM is performing a self-refresh operation. Under this circumstance, the current used for this self-refresh operation is required to be reduced.

It is therefore an exemplary object of the present invention to provide a semiconductor storage device capable of reducing the current consumption during the self-refresh operation.

In order to solve the problems described above, the present invention basically employs techniques described below. It should be understood that various changes and modifications may be made without departing from the scope of the invention, and all these changes and modifications are covered by the invention.

An aspect of the present invention provides a semiconductor storage device in which a word line potential is set to a negative potential when the word line is inactive, and the inactive word line potential is switched from the negative potential to a ground potential during a self-refresh operation.

The semiconductor storage device preferably includes a potential switching circuit for switching the low-potential-side power supply potential to be supplied to a word driver, and the potential switching circuit switches the inactive word line potential from the negative potential to the ground potential during the self-refresh operation.

The semiconductor storage device preferably further includes a negative potential generating circuit, and the negative potential generating circuit halts its operation during the self-refresh operation.

The potential switching circuit preferably switches the inactive word line potential from the negative potential to the ground potential during the self-refresh operation in response to a self-refresh entry signal.

The potential switching circuit preferably comprises a first transfer gate transistor connected between the ground potential and the word driver low-potential-side power supply potential and controlled by the self-refresh entry signal, and a second transfer gate transistor connected between the negative potential and the word driver low-potential-side power supply potential and controlled by an inverted signal of the self-refresh entry signal.

The semiconductor storage device further includes a current mirror circuit receiving a reference potential and the word driver low-potential-side power supply potential as inputs, and a negative potential generating circuit composed of a first transistor receiving an output of the current mirror circuit as a gate input and connected between the word driver low-potential-side power supply potential and the substrate potential. The potential switching circuit is composed of a second transistor receiving the large-amplitude self-refresh entry signal as a gate input and connected between the word driver low-potential-side power supply potential and the ground potential, and a third transistor receiving the self-refresh entry signal as a gate input and connected between the power supply potential and the current mirror circuit. During the self-refresh operation, the third transistor is turned off to halt the operation of the current mirror circuit, while the second transistor is turned on to set the word driver low-potential-side power supply potential to the ground potential, and, during other than the self-refresh operation, the third transistor is turned on to shift the current mirror circuit to the active state, and the word driver low-potential-side power supply potential is set to the negative potential.

The semiconductor storage device of one aspect of the present invention switches the inactive word line potential from a negative potential to a ground potential during the self-refresh operation. A defect current flows in a DRAM having a short-circuit defect in a word line and a bit line. The value of the defect current can be reduced from about 60 uA to a quarter (15 uA) by setting the word line potential to the ground potential. Further, no current is consumed by the pump circuit for generating the negative potential. Consequently, the current consumption is defined only by the defect current (up to 15 uA). Thus, the defect current can be reduced and the current consumption of the pump circuit is eliminated by setting the inactive word line potential to the ground potential during the self-refresh operation. As a result, a semiconductor storage device capable of satisfying a very tight specification for the self-refresh current can be obtained.

DETAILED DESCRIPTION OF THE INVENTION

Exemplary embodiments of a semiconductor storage device of the present invention will be described with reference to the accompanying drawings.

First Exemplary Embodiment

Figure 1A:
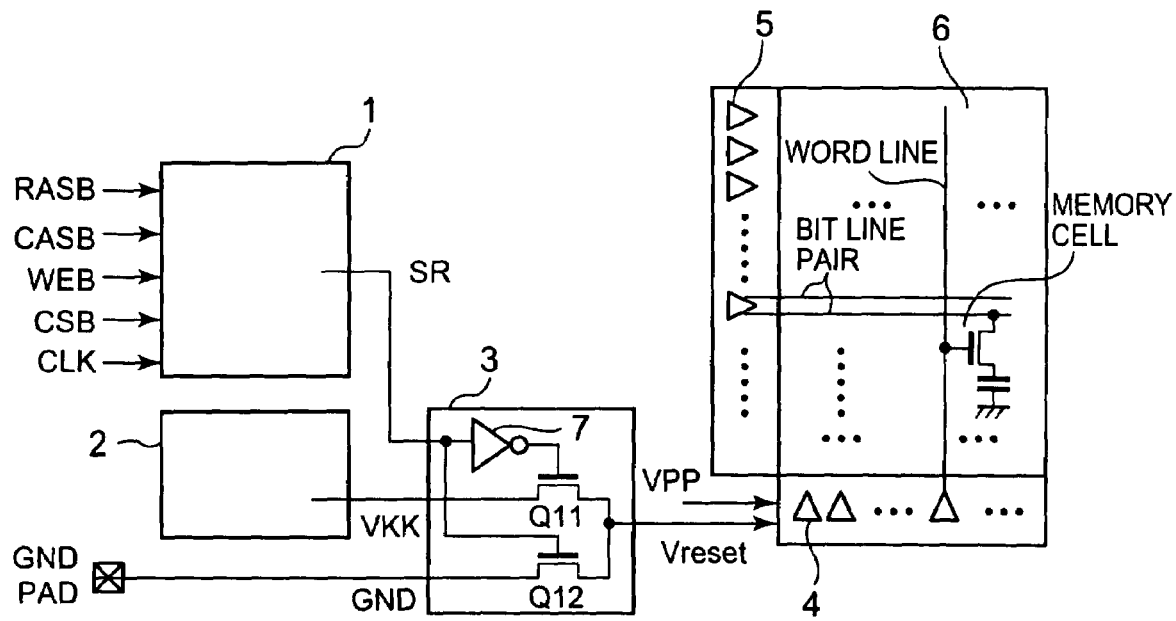
FIG. 1A is a schematic diagram illustrating a semiconductor storage device according to a first exemplary embodiment of the invention.
Figure 1B:
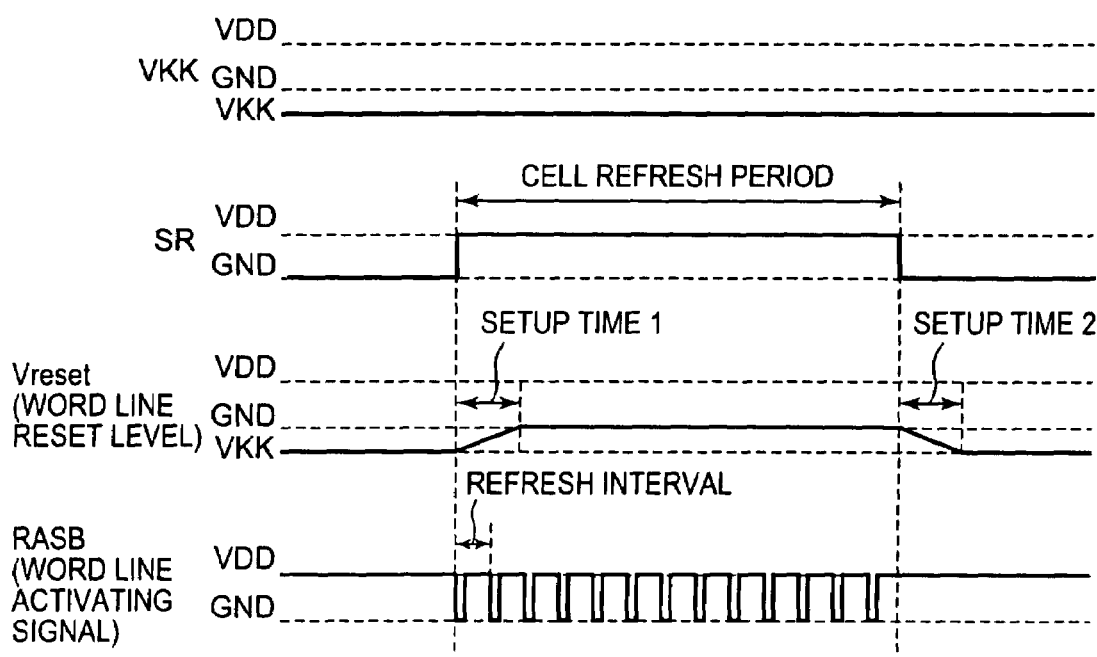
FIG. 1B is an operation timing chart of the semiconductor storage device according to the first exemplary embodiment.

A semiconductor storage device according to a first exemplary embodiment of the present invention will be described in detail with reference to FIGS. 1A and 1B. FIG. 1A is a schematic diagram illustrating a semiconductor storage device according to the present invention. FIG. 1B is an operation timing chart of the semiconductor storage device. The schematic diagram of FIG. 1 only shows a part of the semiconductor storage device relating to the present invention. It is assumed that, although not shown, the semiconductor storage device also includes other components usually required for a DRAM, such as an address system, and a redundancy circuit.

The semiconductor storage device of the present invention includes a command decoder 1 (self-refresh state setting circuit), a VKK pump circuit 2 (VKK generating circuit), a potential switching circuit 3, a word driver group 4 for activating and inactivating word lines, a sense amplifier group 5, and a memory cell group 6. The command decoder 1 receives a command (e.g. RASB or CASB) from the outside and outputs a self-refresh entry signal SR. The VKK pump circuit 2 generates a negative potential VKK. The potential switching circuit 3 switches between a ground potential GND supplied from the outside and a negative potential VKK in response to a self-refresh entry signal SR, and outputs a low-potential-side power supply potential Vreset to the word driver group 4.

The word driver group 4 outputs a high (Hi) level boosting potential VPP to a selected word line while outputting a low (Lo) level low-potential-side power supply potential Vreset to a non-selected word line in accordance with an address received. Each word driver is composed of a CMOS circuit. The word driver is supplied with a boosting potential VPP as a high voltage, high-potential power supply, and supplied with a low-potential-side power supply potential Vreset as a low-voltage, low-potential power supply. Therefore, the word driver outputs the boosting potential VPP as a Hi level signal, and the low-potential-side power supply potential Vreset as a Lo level signal. The ground potential GND is supplied during a self-refresh period and the negative potential VKK is supplied during the remaining period, as this low-potential-side power supply potential Vreset. The sense amplifier group 5 is connected to bit lines of memory cells to exchange data with the memory cells. The memory cell group 6 has the memory cells arranged in matrix.

Subsequently, operation of the DRAM will be described with reference to the timing chart of FIG. 1B.

The timing chart indicates a negative potential VKK, a self-refresh entry signal SR, a low-potential-side power supply potential Vreset defining the potential of an inactive word line, and a word line activating signal RASB. The negative potential VKK is a negative potential lower than the ground potential GND, and constantly exhibits a fixed potential. The self-refresh entry signal SR is at a Hi level during the self-refresh period, and at a Lo level during the remaining period.

The low-potential-side power supply potential Vreset defining the potential of an inactive word line is the ground potential GND during the self-refresh period and is the negative potential VKK during the remaining period. The word line and the sense amplifier are activated while the word line activating signal RASB is at a Lo level, and the word line and the sense amplifier are inactivated while it is at a Hi level. The cycle of the word line activating signal RASB during the self-refresh period is called refresh interval or refresh cycle time, and it takes a value of about 10 uS when the temperature is around 85° C.

Normal read and write operations will be described first. In response to a command signal and an address signal, a desired word line is selected while being changed from a negative potential VKK level (word line inactivation level) to a boosting potential VPP level (word line activation level). The sense amplifier is then activated so that a signal in the memory cell is introduced into the sense amplifier. A write or read operation is then executed according to the command signal. Upon completion of the write or read operation, the word line is shifted from the boosting potential VPP to the negative potential VKK according to the command signal, and the sense amplifier also returns to the inactive state. At the same time as the sense amplifier is inactivated, the bit line is shifted to a predetermined precharge level.

Next, the self-refresh operation will be described. A self-refresh entry signal SR indicating the self-refresh state is shifted from Lo level to Hi level in response to the command signal. At the same time, a predetermined word line is activated and shifted to the boosting potential VPP based on a word line activating signal and an internal address signal provided in the DRAM chip. The activation of the word line causes a signal in the memory cell to be read by the sense amplifier. The sense amplifier is activated by a sense amplifier activation signal to amplify the memory cell signal. The memory cell signal thus amplified is restored in the memory cell via a bit line.

A timer provided in the DRAM measures a time period equivalent to the time required for the memory cell signal to be restored and issues a precharge command. The word line is then shifted from the activation level VPP to the inactivation level Vreset. The sense amplifier is inactivated and the bit line is precharged to the half VARY Further, a self-refresh timer provided in the DRAM chip measures a subsequent word line activation time period. The self-refresh timer issues a word line activation command upon elapse of a predetermined time (refresh interval). At the same time, the internal address signal is counted up so that the word line adjacent to the previous word line is activated.

The aforementioned series of operations are repeatedly and continuously performed during a self-refresh period. All the memory cells can be refreshed by successively activating the word lines while counting up the internal address signal. Thus, all the memory cells are refreshed and information stored in the memory cells held. The self-refresh entry signal SR is kept at the Hi level during the self-refresh period. When the self-refresh state is released, the self-refresh entry signal SR returns to the Lo level. These operations as a whole are the same as the self-refresh operation of a common DRAM.

According to the exemplary embodiment of the present invention, the low-potential-side power supply potential Vreset is controlled by the self-refresh entry signal SR indicating the self-refresh state. The potential switching circuit 3 is composed of an inverter circuit 7, and N-channel type transistors Q11 and Q12. The inverter circuit 7 receives a self-refresh entry signal SR and outputs its inverted signal to the gate of the N-channel type transistor Q11. The N-channel type transistor Q11 is connected to a negative potential VKK from the VKK pump circuit 2 and to the low-potential-side power supply potential of the word driver, and is controlled by the inverted signal of the self-refresh entry signal SR received at its gate. The N-channel type transistor Q12 is connected to the ground potential GND and the low-potential-side power supply potential of the word driver, and is controlled by the self-refresh entry signal SR received at its gate.

The N-channel type transistors Q11 and Q12 of the potential switching circuit 3 operate as transfer gates. Receiving the self-refresh entry signal SR, the N-channel type transistors Q11 and Q12 switches between the negative potential VKK and the ground potential GND to select a potential to be supplied as the low-potential-side power supply potential Vreset. When the self-refresh entry signal SR is at the Hi level, the N-channel type transistor Q12 is turned on to supply the ground potential GND. When the self-refresh entry signal SR is at the Lo level, the N-channel type transistor Q11 is turned on to supply the negative potential VKK. A negative potential of −0.3 V is generated and supplied by the VKK pump circuit 2 as the negative potential VKK. Thus, according to the exemplary embodiment of the present invention, the ground potential GND is supplied as the inactivation level of the word line during the self-refresh operation of the DRAM.

As shown in FIG. 1B, the low-potential-side power supply potential Vreset is set to the negative potential VKK level all the time except for during the self-refresh period. During the self-refresh period, the low-potential-side power supply potential Vreset is set to the ground potential GND level. When entering and exiting the self-refresh period, the low-potential-side power supply potential Vreset has a setup time 1 and a setup time 2, respectively. The word line can be activated during these setup time 1 and the setup time 2. In this case, an intermediate potential between the negative potential VKK and the ground potential GND is supplied as the inactivation level. Since the setup time 1 or the setup time 2 lasts only several tens of ns, it does not adversely affect the operation or reliability of the DRAM.

The low-potential-side power supply potential Vreset is set to the ground potential GND during the self-refresh period. Therefore, the potential of the non-selected word line becomes the ground potential. If there exists a short-circuit defect in a word line or a bit line of the DRAM, the defect causes a leak current to flow. The leak current is 60 uA when the potential of the non-selected word line is a negative potential. The leak current is reduced to about a quarter (about 15 uA) when the potential of the non-selected word line is the ground potential. A reason why the leak current can be largely reduced will explained as follows. Specifically, if the potential of the non-selected word line is the negative potential VKK, the current consumption of the VKK pump circuit generating the negative potential VKK can be reduced.

No negative potential VKK is used during the self-refresh period. Consequently, the operation of the VKK pump circuit is halted. Since no current flows through the VKK pump circuit, the potential VKK is held at a fixed level without pumping operation. As a result, the VKK pump circuit consumes no current any more. During the self-refresh period, therefore, the current consumption is defined only by the defect current itself (up to 15 uA). In the case of a 256M-bit DRAM, the current consumption (IDD6) during the self-refresh period assumes a value of about 150 to 200 uA at a temperature of 40° C. Accordingly, the current reduction of 45 uA corresponds to about 20% to 30% of the entire consumption of the DRAM. This is a significant reduction.

The semiconductor storage device according to the first exemplary embodiment of the present invention sets the inactive word line potential during the self-refresh operation to the ground potential GND. The setting of the inactive word line potential to the ground potential GND reduces the leak current when there exists a short-circuit defect in the word line or the bit line. Further, since no negative potential VKK is used, the current consumption of the pump circuit for generating the negative potential VKK can be reduced. This makes it possible to satisfy the specification for the current consumption (IDD6) during the self-refresh operation. In this manner, a semiconductor storage device capable of satisfying the specification for the current consumption (IDD6) during the self-refresh operation can be obtained by setting the inactive word line potential to the ground potential GND during the self-refresh operation.

Second Exemplary Embodiment

Figure 2A:
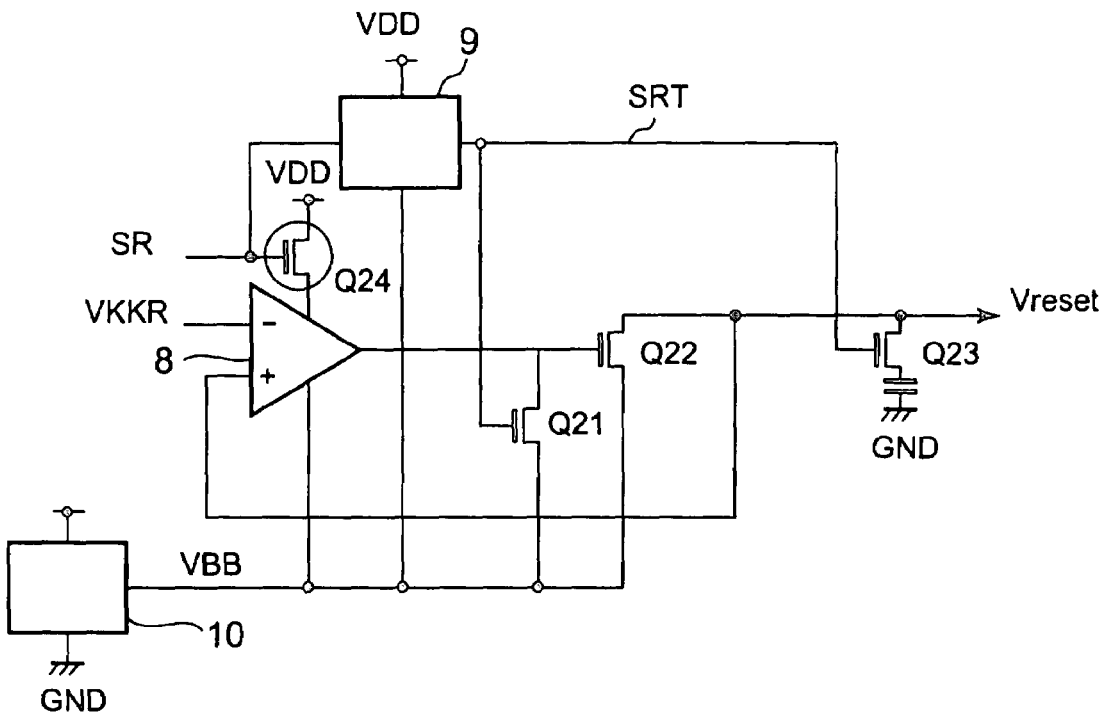
FIG. 2A is a schematic circuit diagram illustrating a low-potential supply circuit according to a second exemplary embodiment of the invention.

A semiconductor storage device according to a second exemplary embodiment of the present invention will be described with reference to FIGS. 2A and 2B.

According to the second exemplary embodiment, no pump circuit is separately provided for generating the negative potential VKK. Instead, a substrate potential VBB is utilized to generate the negative potential VKK. Specifically, the VKK pump circuit 2 and the potential switching circuit 3 shown in FIG. 1A are combined together to form a supply circuit for supplying the low-potential-side power supply potential Vreset. FIG. 2A is a schematic circuit diagram illustrating the Vreset supply circuit. FIG. 2B is an operation timing chart of this circuit.

The Vreset supply circuit includes a VBB pump power supply circuit 10, a current mirror circuit 8, a voltage conversion circuit 9, N-channel type transistors Q21, Q22 and Q23, and a P-channel type transistor Q24. With this structure, the VBB pump power supply circuit 10, the current mirror circuit 8, and the N-channel type transistor Q22 together correspond to the VKK pump circuit 2 of the first exemplary embodiment. The voltage conversion circuit 9, the N-channel type transistors Q21 and Q23, and the P-channel type transistor Q24 together correspond to the potential switching circuit 3 of the first exemplary embodiment.

The VBB pump power supply circuit 10 is a circuit for generating the substrate potential VBB. The substrate potential VBB is supplied to the low-potential-side power supply of the current mirror circuit 8 and the voltage conversion circuit 9, and to the source of the N-channel type transistors Q21 and Q22. The substrate potential VBB is at a minus level (negative level) and is a power supply assuming a value of −0.5 V, for example. This is a power supply that every DRAM has, and is used as a substrate potential of the memory cell transistor or the N-channel type transistor of a sense amplifier arranged in the memory array region. Accordingly, the substrate potential VBB is used in common to generate the negative potential VKK.

The current mirror circuit 8 receives a reference potential VKKR and a low-potential-side power supply potential Vreset as inputs, and outputs to the drain of the N-channel type transistor Q21 and the gate of the N-channel type transistor Q22. The high-potential-side power supply potential of the current mirror circuit 8 is connected to the drain of the P-channel type transistor Q24, while the low-potential-side power supply potential is connected to the substrate potential VBB. The current mirror circuit 8 is activated when the self-refresh entry signal SR is at the Lo level, that is, during other than the self-refresh period, and controls such that low-potential-side power supply potential Vreset is equal to the reference potential VKKR. The reference potential VKKR is the same potential level as the negative potential VKK. The voltage conversion circuit 9 receives a power supply potential VDD and a substrate potential VBB as power supply, receives a self-refresh entry signal SR as an input, outputs a large-amplitude self-refresh entry signal SRT which is converted in level in the same phase as the self-refresh entry signal SR.

The drain, source and gate of the N-channel type transistor Q21 are connected to the output of the current mirror circuit 8, the substrate potential VBB, and the large-amplitude self-refresh entry signal SRT, respectively. The drain, source and gate of the N-channel type transistor Q22 are connected to the low-potential-side power supply potential Vreset, the substrate potential VBB, and the output of the current mirror circuit 8, respectively. The drain, source and gate of the N-channel type transistor Q23 are connected to the low-potential-side power supply potential Vreset, the ground potential GND, and the large-amplitude self-refresh entry signal SRT, respectively. The drain, source and gate of the P-channel type transistor Q24 are connected to the high-potential side power supply potential of the current mirror circuit 8, the power supply potential VDD, and the self-refresh entry signal SR, respectively.

Since the substrate potential VBB is a power supply potential of a minus level, the negative potential VKK can be generated by a circuit having this power supply potential as the low-potential-side power supply potential. In general, both the substrate potential VBB and the negative potential VKK are at a minus level. For example, the substrate potential VBB is −0.5V, while the negative potential VKK is −0.3 V. The negative potential VKK is set to an intermediate potential between the substrate potential VBB and the ground potential GND. The Vreset supply circuit for supplying the low-potential-side power supply potential to the word driver sets the low-potential-side power supply potential Vreset to the negative potential VKK when the self-refresh entry signal SR is at the Lo level, that is, during other than the self-refresh period. When the self-refresh entry signal SR is at the Hi level, that is, during the self-refresh period, the low-potential-side power supply potential Vreset is set to the ground potential GND.

When the self-refresh entry signal SR is at the Lo level, the P-channel type transistor Q24 is turned on and the N-channel type transistors Q21 and Q23 are turned off. When the P-channel type transistor Q24 is turned on, the current mirror circuit 8 is supplied with the power supply potential VDD and shifted to the active state. The current mirror circuit 8 and the N-channel type transistor Q22 control the Vreset so as to be equal to the VKKR (=VKK). When the self-refresh entry signal SR is at the Hi level, the P-channel type transistor Q24 is turned off. Consequently, the operation of the current mirror circuit 8 is halted. The output of the current mirror circuit 8 drops down to the substrate potential. The N-channel type transistors Q21 and Q23 are turned on and the low-potential-side power supply potential Vreset becomes the ground potential GND. The conversion circuit 9 generates the substrate potential VBB as the Lo level potential and the power supply potential VDD as the Hi level potential so that the N-channel type transistors Q21 and Q23 can be reliably turned on and off.

Figure 2B:
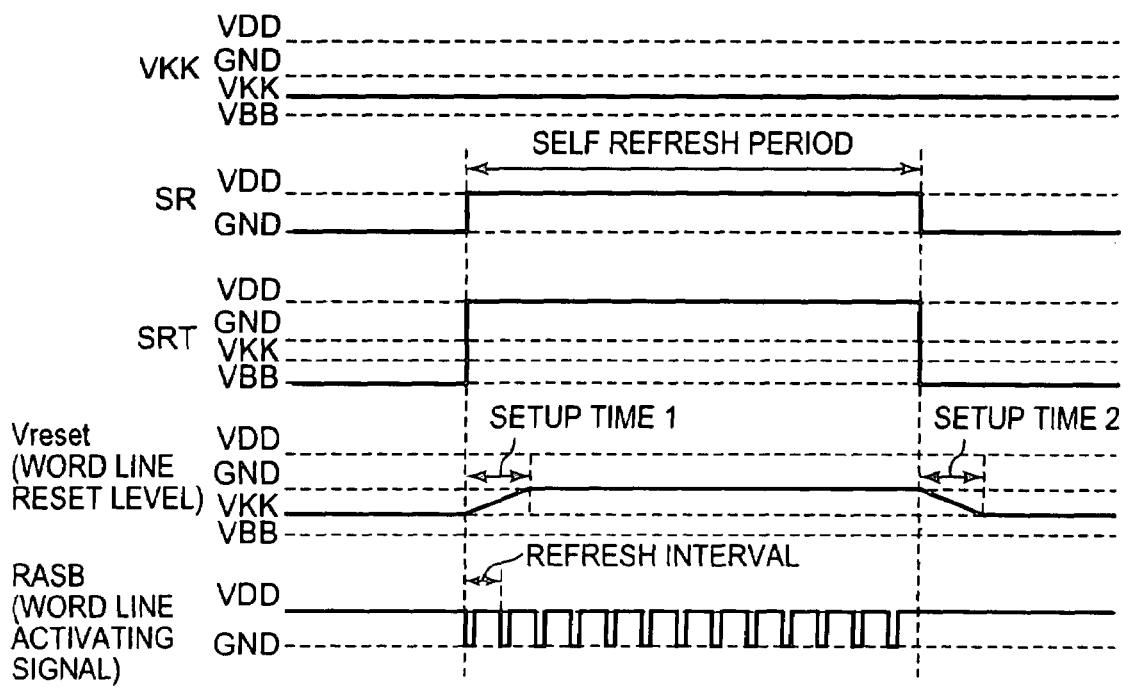
FIG. 2B is an operation timing chart of the low-potential supply circuit according to the second exemplary embodiment.

FIG. 2B shows an operation timing chart.

The timing chart indicates the negative potential VKK, the self-refresh entry signal SR, the large-amplitude self-refresh entry signal SRT, the word driver low-potential-side power supply potential Vreset, and a word line activating signal RASB. The time chart in FIG. 2B is different from FIG. 1B in that the large-amplitude self-refresh entry signal SRT is added. The operation shown in the time chart of FIG. 2B is substantially the same as FIG. 1B and is easily understandable. Therefore, the description thereof will be omitted here.

The semiconductor storage device according the second exemplary embodiment of the present invention sets the word line inactivation level during the self-refresh operation to the ground potential GND. The setting of the word line inactivation level to the ground potential GND reduces the leak current even if there exists a short-circuit defect in the word line or the bit line. Further, since no negative potential VKK is used, the current consumption of the VKK pump circuit 2 for generating the negative potential VKK can be reduced. As a result, it is possible to satisfy the current consumption specification (IDD6) during the self-refresh operation. Thus, a semiconductor storage device capable of satisfying the specification for the current consumption (IDD6) during the self-refresh operation can be obtained by setting the word line inactivation potential to the ground potential GND during the self-refresh operation.

Although the present invention has been described specifically in its preferred embodiments, the present invention is not limited to these embodiments. It should be understood that various changes and modifications may be made without departing from the spirit and scope of the invention and all such changes and modifications are covered by the appended claims.

The present invention is applicable to various storage devices such as DRAMs or pseudo SRAMs, which require a refresh operation of memory cells.

What is claimed is:

1. A semiconductor storage device in which an inactive word line potential is set to a negative potential when a word line is inactive,
   wherein the inactive word line potential is switched from the negative potential to a ground potential during a self-refresh operation.

2. The semiconductor storage device according to claim 1, comprising:
   a potential switching circuit for switching a low-potential-side power supply potential to be supplied to a word driver,
   wherein the potential switching circuit switches the inactive word line potential from the negative potential to the ground potential during the self-refresh operation.

3. The semiconductor storage device according to claim 2, further comprising:
   a negative potential generating circuit for providing the negative potential,
   wherein the negative potential generating circuit halts an operation during the self-refresh operation.

4. The semiconductor storage device according to claim 2, wherein the potential switching circuit switches the inactive word line potential from the negative potential to the ground potential during the self-refresh operation in response to a self-refresh entry signal.

5. The semiconductor storage device according to claim 4, wherein the potential switching circuit comprises:
   a first transfer gate transistor which is connected between the ground potential and the low-potential-side power supply potential of the word driver and which is controlled by the self-refresh entry signal; and
   a second transfer gate transistor which is connected between the negative potential and the low-potential-side power supply potential of the word driver and which is controlled by an inverted signal of the self-refresh entry signal.

6. The semiconductor storage device according to claim 2, further comprising:
   a current mirror circuit which receives a reference potential and the low-potential-side power supply potential of the word driver; and
   a negative potential generating circuit which includes a first transistor receiving an output of the current mirror circuit as a gate input and connected between the low-potential-side power supply potential of the word driver and a substrate potential,
   wherein the potential switching circuit includes a second transistor receiving a self-refresh entry signal as a gate input and connected between the low-potential-side power supply potential of the word driver and the ground potential, and a third transistor receiving the self-refresh entry signal as a gate input and connected between the power supply potential and the current mirror circuit,
   wherein during the self-refresh operation, the third transistor is turned off to halt an operation of the current mirror circuit, while the second transistor is turned on to set the low-potential-side power supply potential of the word driver to the ground potential, and
   wherein during other than the self-refresh operation, the third transistor is turned on to shift the current mirror circuit to an active state, and the low-potential-side power supply potential of the word driver is set to the negative potential.

7. The semiconductor storage device of claim 3, wherein the negative potential generating circuit consumes no current when halting the operation during the self-refresh operation by having no current flowing through the negative potential generating circuit.

8. The semiconductor storage device of claim 3, wherein the negative potential generating circuit generates a substrate potential as the negative potential switched to the ground potential by the potential switching circuit during the self-refresh operation, and wherein the negative potential generating circuit and the potential switching circuit are integrated into a single supply circuit for supplying the low-potential-side power supply potential to the word driver.

9. A power supply circuit of a semiconductor storage device, the power supply circuit comprising:

a first circuit part for providing a negative potential; and a second circuit part for setting an inactive word line potential to the negative potential when a word line is inactive, and for switching an inactive word line potential from the negative potential to a ground potential during a self-refresh operation of the semiconductor storage device.

10. The power supply circuit of claim 9, wherein the first circuit part is integrated with the second circuit part, wherein the integrated first and second circuit parts provide a substrate potential generating the negative potential.

11. The power supply circuit of claim 9, wherein the second circuit part switches a low-potential-side power supply potential to be supplied to a word driver during the self-refresh operation.

12. The power supply circuit of claim 9, wherein the second circuit part halts an operation during the self-refresh operation.

13. The power supply circuit of claim 9, wherein the second circuit part switches the inactive word line potential from the negative potential to the ground potential during the self-refresh operation in response to a self-refresh control signal.

14. The power supply circuit according to claim 11, wherein the second circuit part comprises:

a first switching unit including a grounded first electrode, the first switch unit for providing, through a second electrode, a ground potential from the first electrode to the low-potential-side power supply potential of the word driver according to a self-refresh entry signal received at a control electrode of the first switching unit, the control electrode controlling a current flow between the first and second electrodes of the first switching unit, and a second switching unit for receiving the negative potential through a first electrode, and for providing, through a second electrode, the negative potential to the low-potential-side power supply potential of the word driver according to an inverted signal of the self-refresh entry signal received at a control electrode of the second switching unit, the control electrode controlling a current flow between the first and second electrodes of the second switching unit.

15. The power supply circuit according to claim 11, further comprising a current mirror circuit which receives a reference potential and a low-potential-side power supply potential of the word driver, wherein the first circuit part comprises a negative potential generating circuit which includes a first transistor receiving an output of the current mirror circuit as a gate input and connected between the low-potential-side power supply potential of the word driver and a substrate potential.

16. The power supply circuit according to claim 11, wherein the second circuit part includes a first transistor receiving a self-refresh entry signal as a gate input and connected between the low-potential-side power supply potential of the word driver and the ground potential, and a second transistor receiving the self-refresh entry signal as a gate input and connected between the power supply potential and a current mirror circuit which receives a reference potential and a low-potential-side power supply potential of the word driver.

17. The power supply circuit according to claim 11, wherein during the self-refresh operation, a transistor of the second circuit part is turned off to halt an operation of a current mirror circuit which receives a reference potential and a low-potential-side power supply potential of the word driver, while a second transistor of the second circuit part is turned on to set the low-potential-side power supply potential of the word driver to the ground potential.

18. The power supply circuit according to claim 17, wherein during any time other than the self-refresh operation, the second transistor is turned on to shift the current mirror circuit to an active state, and the low-potential-side power supply potential of the word driver is set to the negative potential.

19. A method of reducing current consumption in a semiconductor storage device, the method comprising:

setting an inactive word line potential to a negative potential when a word line is inactive; and switching the inactive word line potential from the negative potential to a ground potential during a self-refresh operation.

20. The method according to claim 19, wherein the switching of the inactive word line potential comprises switching the inactive word line potential from the negative potential to the ground potential during the self-refresh operation in response to a received self-refresh entry signal.

* * * * *